United States Patent
Lin et al.

(10) Patent No.: US 7,542,891 B2
(45) Date of Patent: Jun. 2, 2009

(54) METHOD OF CORRELATING SILICON STRESS TO DEVICE INSTANCE PARAMETERS FOR CIRCUIT SIMULATION

(75) Inventors: Xi-Wei Lin, Fremont, CA (US); Victor Moroz, Saratoga, CA (US); Dipankar Pramanik, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 406 days.

(21) Appl. No.: 11/470,978

(22) Filed: Sep. 7, 2006

(65) Prior Publication Data

US 2008/0127005 A1    May 29, 2008

(51) Int. Cl.
*G06F 17/50* (2006.01)
(52) U.S. Cl. .................. 703/14; 703/2; 716/4; 716/11; 438/14
(58) Field of Classification Search .................. 703/13, 703/14, 2; 716/4, 5, 8, 11; 438/14, 17, 224, 438/296, 426; 257/E21.409, E21.633
See application file for complete search history.

(56) References Cited

U.S. PATENT DOCUMENTS

| | | | |
|---|---|---|---|
| 6,831,292 B2 | 12/2004 | Currie et al. | |
| 6,881,632 B2 | 4/2005 | Fitzgerald et al. | |
| 7,337,420 B2* | 2/2008 | Chidambarrao et al. | 716/8 |
| 7,437,260 B2* | 10/2008 | Ausserlechner et al. | 702/107 |
| 7,440,861 B2* | 10/2008 | Ausserlechner et al. | 702/107 |
| 2003/0173588 A1 | 9/2003 | Bianchi | |
| 2007/0202652 A1* | 8/2007 | Moroz et al. | 438/296 |
| 2007/0202663 A1* | 8/2007 | Moroz et al. | 438/426 |
| 2007/0204250 A1* | 8/2007 | Moroz et al. | 716/10 |

OTHER PUBLICATIONS

Bianchi, R.A., et al., "Accurate Modeling of Trench Isolation Induced Mechanical Stress Effects on MOSFET Electrical Performance," IEEE IEDM Tech. Digest, (Dec. 2002) 117-120.
Xi, Xuemei, et al. "BSIM4.3.0 Model, Enhancements and improvements Relative to BSIM4.2.1." UC Berkeley (2003) available at http://www-device.eecs.berkeley.edu/~bsim3/BSIM4/BSIM430/doc/BSIM430_Enhancement.pdf#search='bsim4.3.0'.

(Continued)

*Primary Examiner*—Russell Frejd
(74) *Attorney, Agent, or Firm*—Warren S. Wolfeld; Haynes Beffel & Wolfeld LLP

(57) ABSTRACT

Roughly described, standard SPICE models can be modified by substituting a different stress analyzer to better model the stress adjusted characteristics of a transistor. A first, standard, stress-sensitive, transistor model is used to develop a mathematical relationship between the first transistor performance measure and one or more instance parameters that are available as inputs to a second, stress-insensitive, transistor model. The second transistor model may for example be the same as the first model, with its stress sensitivity disabled. Thereafter, a substitute stress analyzer can be used to determine a stress-adjusted value for the first performance measure, and the mathematical relationship can be used to convert that value into specific values for the one or more instance parameters. These values are then provided to the second transistor model for use in simulating the characteristics of the particular transistor during circuit simulation.

25 Claims, 9 Drawing Sheets

OTHER PUBLICATIONS

Nouri, F., et al. "A Systematic Study of Trade-Offs in Engineering a Locally Strained pMOSFET," Proc. IEDM (2004) 1055-1058.

Thompson, Scott E., "A 90-NM Logic Technology Featuring Strained-Silicon," IEEE Transactions on Electron Devices (2004) pp. 1-8.

Eneman, G, et al., "Layout Impact on the Performance of a Locally Strained PMOSFET," Symposium on VLSI Technology Digest of Technical Papers (2005) 22-23.

Moroz, Victor, et al. "Analyzing Strained-Silicon Options for Stress-Engineering Transistors," Solid State Technology (Jul. 2004) 3 pages.

Kanda, Yozo, "A Graphical Representation of the Piezoresistance Coefficients in Silicon," IEEE Transactions on Electron Devices, vol. ED-29, No. 1, Jan. 1982, 64-70.

Smith, Charles S., "Piezoresistance Effect in Germanium and Silicon," Physical Review, vol. 94, No. 1, Apr. 1, 1954, 42-48.

Smith, Lee, et al., "Exploring the Limits of Stress-Enhanced Hole Mobility," IEEE Electron Device Letters, vol. 26, No. 9, Sep. 2005, 652-654.

Moroz, Victor, et al., "Options at the 45nm Node Include Engineered Substrates," Solid State Technology (Jul. 2005) 4 pages.

Smit, G.D.J., et al., "PSP 102.0" The Pennsylvania State University and Philips Research, (Jun. 2006) 112 pages.

Gildenblat, G., et al., "PSP Model" Department of Electrical Engineering, The Pennsylvania State University and Philips Research, (Aug. 2005) 82 pages.

\* cited by examiner

METHOD OF CORRELATING SILICON STRESS TO DEVICE INSTANCE PARAMETERS FOR CIRCUIT SIMULATION

1. FIELD OF THE INVENTION

The invention relates to circuit simulation techniques, and more particularly to adjustment of device instance parameters in such a simulation to account for stress impacts on transistor performance.

2. BACKGROUND AND SUMMARY OF THE INVENTION

Because the fabrication of prototype integrated circuit designs is expensive and time consuming, it is typical for circuit designers to first simulate their designs using computer simulation tools. In this way corrections can be made before the time and expense of prototype fabrication is incurred. One popular family of circuit simulators, especially useful for analog performance verification and behavior prediction, is known generically as SPICE (Simulation Program with Integrated Circuits Emphasis). The family includes the original SPICE program, numerous subsequent versions of the program, and numerous offshoots available from other sources. Circuit simulators are used often for predicting and verifying, among other things, the steady state analog behavior of a circuit, the transient analog behavior of a circuit, and the RF behavior of a circuit.

Generally, analog circuit simulators operate by describing the circuit in terms of nodes and devices. Each terminal of a device constitutes a node of the circuit. Different nodes can be connected together. Each device is described by a device "model", which either formulaically or algorithmically defines performance measures such as the current/voltage relationships that the device imposes on its terminals. Often a number of different models are available for use in describing a particular kind of device. For example, a large number of models are available to describe a Metal-Oxide-Semiconductor Field-Effect Transistor (MOSFET), some designed for fast computation and others designed for better accuracy and for taking into account particular semiconductor effects. Typically the models require the user to specify values for a number of global parameters that apply to all transistors represented by the model, and optionally also allow the user to specify values for a number of instance parameters that are to apply to only one particular transistor instance. Some models are based on parameter values to be entered explicitly by the user, such as VTO and ION, but most are based on transistor layout characteristics such as channel length and width.

It has long been known that semiconductor materials such as silicon and germanium exhibit the piezoresistive effect (mechanical stress-induced changes in electrical resistance). See for example C. S. Smith, "Piezoresistance effect in germanium and silicon", Phys. Rev., vol. 94, pp. 42-49 (1954), incorporated by reference herein. The piezoresistive effect has formed the basis for certain kinds of pressure sensors and strain gauges, but only recently has it received attention in the manufacture of integrated circuits. In integrated circuit fabrication, one of the major sources of mechanical stress is the differential expansion and contraction of the different materials used. For example, typical fabrication technologies involve electrically isolating the active regions of groups of one or more transistor by surrounding them with shallow trench isolation (STI) regions which are etched into the silicon and then filled with an insulator, such as an oxide. During cooling, oxides tend to shrink less than the surrounding silicon, and therefore develop a state of compressive stress laterally on the silicon regions of the device. Of significance is the stress exerted by the STI regions on the silicon forming a MOSFET channel, because the piezoresistive impact of such stress can affect carrier mobility, and therefore both current flow through the channel (Ion) and transistor switching speed.

The stress exerted on a region of silicon decays rapidly as a function of distance from the stress-causing interfaces. In the past, therefore, while process technologies could not produce today's extremely narrow channel widths, the stress-induced impact on performance could be ignored because only the edges of the diffusion region (adjacent to the STI regions) were affected. The channel regions were too far away from the STI regions to exhibit any significant effect. As process technologies have continued to shrink, however, the piezoresistive effect on transistor performance is no longer negligible.

Technology Computer Aided Design (TCAD) models are frequently used to model the behavior of integrated circuit devices at the level of individual transistors. Behaviors characterized at this level can be fed back to improve the circuit layout or the fabrication process, or they can be used to derive circuit level parameters (e.g. SPICE parameters) of the device for subsequent analysis of the circuit at macroscopic levels. TCAD analysis has long been able to take stress effects into account, but only by performing 3-dimensional finite element analysis of a single transistor or a small fragment of the chip. The computation time required to obtain accurate results, however, limited the utility of this kind of analysis to only small regions of a chip layout that include only several transistors. For example, it has not been practical to perform a TCAD analysis to obtain reasonably accurate circuit level parameters for layout regions larger than about a dozen transistors, or about 2-3 diffusion regions. Even then, huge amounts of CPU time, up to several hours per transistor, were required to obtain reasonably accurate results. Even as computing power increases, the required computation time continues to make this approach prohibitively expensive for any large fragments of the chip layout.

The simplified transistor models in SPICE are provided to drastically reduce the computing power necessary to simulate a circuit, for situations in which the accuracy of full finite element analysis is not critical. The simplified models are constantly undergoing improvement, the effort usually being to improve simulation accuracy while continuing to avoid a full finite element analysis. Recently, a simplified model was developed for taking into account stress effects on electron and hole mobilities. See R. A. Bianchi et al., "Accurate Modeling of Trench Isolation Induced Mechanical Stress Effects on MOSFET Electrical Performance," IEEE IEDM Tech. Digest, pp. 117-120 (December 2002), and U.S. Patent Publication No. 2002/0173588 (2003), now U.S. Pat. No. 6,569,941, both incorporated herein by reference. A variation of this model, with some additional fitting terms and parameters, was incorporated into Revision 4.3.0 of the Berkeley BSIM standard model. See Xuemei (Jane) Xi, et al., "BSIM4.3.0 Model, Enhancements and Improvements Relative to BSIM4.2.1", University of California at Berkeley (2003), available at http://www-device.eecs.berkeley.edu/~bsim3/BSIM4/BSIM430/doc/BSIM430_Enhance ment.pdf, incorporated by reference herein. The model is known as the Length of Diffusion (LOD) model, since its primary parameter is the length of the diffusion region on each side of the channel of a transistor under study. Roughly, the user enters instance parameter values that describe the LOD at different segments along the width of the channel, and a procedure in the model calculates a weighted average LOD for the entire channel width. It then calculates a stress based on the weighted average LOD, and then converts that stress value to a change in mobility. The change in mobility is applied to the value of the global mobility parameter to develop the mobility that will be used for further calculations within the model. This mobility value is also itself available as an output of the model. The LOD method for approximating a carrier mobility adjustment has now been incorporated into certain SPICE models for describing a MOSFET device.

The LOD model is one example of what is referred to herein as a "simplified" model for evaluating stress effects on transistor performance. Any model that trades off accuracy in favor of computation speed, as compared to a full finite element analysis, is considered herein to be a "simplified" model. Other simplified models have been proposed as well, such as the model described in U.S. patent application Ser. No. 11/291,294, filed 1 Dec. 2005, entitled Analysis Of Stress Impact On Transistor Performance, incorporated by reference in its entirety herein, but these have not yet been incorporated into standardized SPICE device models.

Unfortunately, the LOD model has a number of deficiencies. First, the model is limited to STI-induced stress. It therefore ignores many other potential sources of stress. For example, some integrated circuit manufacturers form SiGe in the source and drain areas of a p-channel transistor intentionally to induce certain stresses on the channel; this source of stress is not taken into account in the LOD model, nor are stresses induced by differential coefficients of expansion of superposing layers. Additionally, several semiconductor manufacturers use strained cap layers covering the transistors on top of the gate stacks. It is typical to use tensile nitride cap layers for n-channel transistors and compressive nitride cap layers for p-channel transistors. Some other potential stress sources include tensile STI that is beneficial for both n-channel and p-channel transistors and tensile Si:C (carbon-doped silicon) in the source/drain of the n-channel transistors. None of these stress sources are taken into account by the LOD methodology.

Second, the LOD model fails to take into account stresses that might be present transversely to the length of diffusion, across the channel width-wise. It has been discovered that compressive stress in this direction can affect carrier mobility in the channel in significant and surprising ways.

Third, more generally than the second deficiency, since the LOD model considers only hydrostatic pressure, which is a sum of all normal (i.e. volume changing rather than rotational) stress components, it fails to take into account differing vector stress components. Different stress components relative to the channel direction are known to affect carrier mobility differently.

Fourth, the LOD model fails to take into account the presence of other structures in the neighborhood of a region under study, apart from the nearest STI interface. Other structures beyond this interface might reduce the amount of oxide presumed to be exerting a force, and therefore might reduce the actual stress in the channel.

Accordingly, it would be extremely desirable to provide a way of adjusting standard SPICE device models to account for the stress impact on transistor characteristics, more accurately than does the LOD model.

Roughly described, this can be accomplished by first selecting a first transistor performance measure that is affected by stress in the transistor channel, and then using a first, stress-sensitive, transistor model to develop a mathematical relationship between the first transistor performance measure and one or more instance parameters that are available as inputs to a second, stress-insensitive, transistor model.

The first transistor model is typically one that is not as accurate as desired, but is acceptably accurate for certain types of layout geometries. The second transistor model may for example be the same as the first model, with its stress sensitivity disabled. Once the mathematical relationship has been determined, any other stress analyzer can be used in substitution for the stress aspects of the first model. Specifically, the substitute stress analyzer can be used to determine a stress-adjusted value for the first performance measure, and the mathematical relationship is used to convert that value into specific values for the one or more instance parameters. These values are then provided to the second, stress-insensitive, transistor model for use in simulating the characteristics of the particular transistor during circuit simulation. In essence the instance parameter values (or variations in them) can be thought of as substituting for the stress analysis that the first transistor model would have applied.

Preferably the substitute stress analyzer is more accurate than the stress sensitive aspects of the first transistor model, or is more accurate for at least some layout conditions, or takes more different layout conditions into account than do the stress sensitive aspects of the first transistor model. In an example, the stress analysis performed by the first model is LOD-based, and the stress analysis performed by the substitute stress analyzer takes into account one or more of the stress sources or layout features not taken into account by the LOD model. In an example, the first performance measure is carrier mobility (electron mobility for N-channel devices, and hole mobility for P-channel devices).

In an embodiment, the substitute stress analyzer itself relies on calibration coefficients that must be determined empirically. In this embodiment, the calibration coefficients are determined such that the substitute stress analyzer generates the same values for the first transistor performance measure that would be generated by the first (stress-sensitive) transistor model, at least for a subset of layout geometries for which the first transistor model generates what are deemed to be relatively accurate values for the first performance measure.

In an embodiment, the mathematical relationship between the first transistor performance measure and the instance parameters is developed by using the first transistor model to simulate a plurality of test transistors to determine a value for a second performance measure for each test transistor. The second performance measure preferably (but not necessarily) is different from the first performance measure, and may for example be data representing a set of I-V curves for the particular test transistor. The second transistor model is then used to simulate the same plurality of test transistors to determine corresponding instance parameter values that, when applied in the second model, generate the same values for the second performance measure as were developed using the first transistor model. Each test transistor thus has associated therewith both a value for the first performance measure, as generated by the first transistor model, and a set of instance parameter values, that can be used in the second transistor model in substitution for the stress calculations of the first transistor model. The resulting correlation between particular sets of instance parameter values and corresponding first performance measure values either can be retained in tabular format, or can be fit to one or more mathematical functions. In either case, the desired mathematical relationship has been established.

The above mechanism thus enables a system to perform circuit simulation in a manner that is consistent with the first transistor model so far as it goes, but extended in a manner consistent with additional insights captured by the substitute model. Other uses for the above mechanism will also be apparent to the reader.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
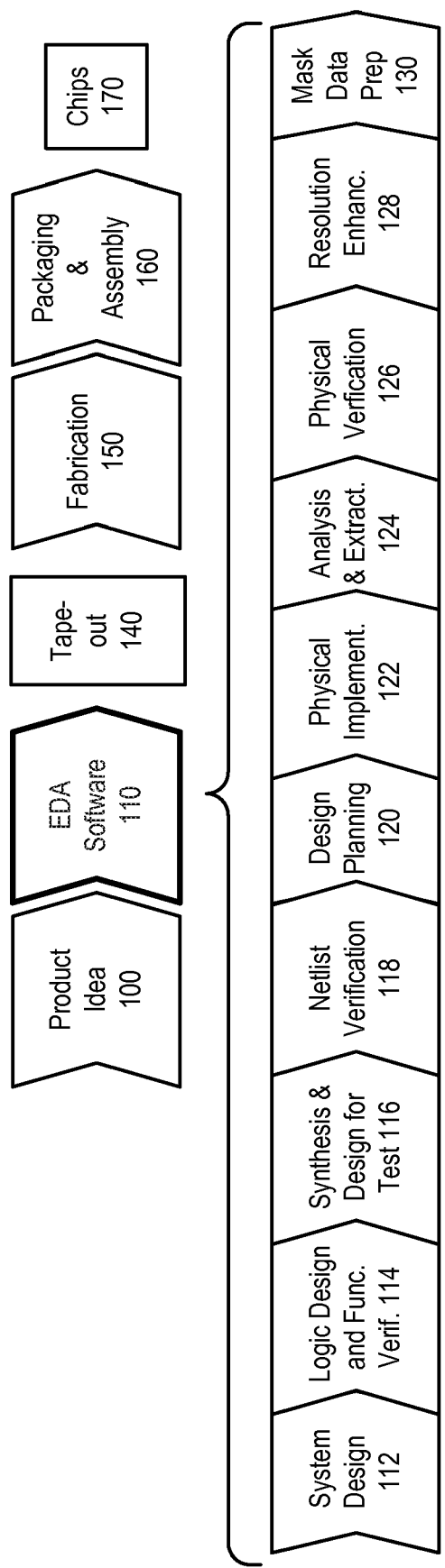
FIG. 1 shows a simplified representation of an illustrative digital integrated circuit design flow incorporating the invention.

FIG. 1 shows a simplified representation of an illustrative digital integrated circuit design flow. At a high level, the process starts with the product idea (step 100) and is realized in an EDA (Electronic Design Automation) software design process (step 110). When the design is finalized, it can be taped-out (step 140). After tape out, the fabrication process (step 150) and packaging and assembly processes (step 160) occur resulting, ultimately, in finished integrated circuit chips (result 170).

The EDA software design process (step 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and IC Compiler products.

Physical implementation (step 122): The placement (positioning of circuit elements) and routing (connection of the same) occurs at this step. Example EDA software products from Synopsys, Inc. that can be used at this step include the Astro and IC Compiler products.

Analysis and extraction (step 124): At this step, the circuit function is verified at a transistor level, this in turn permits what-if refinement. Example EDA software products from Synopsys, Inc. that can be used at this step include AstroRail, PrimeRail, Primetime, and Star RC/XT products. Certain aspects of the invention, specifically the results of the calibration procedures described herein, can be applied during this step.

Physical verification (step 126): At this step various checking functions are performed to ensure correctness for: manufacturing, electrical issues, lithographic issues, and circuitry. Example EDA software products from Synopsys, Inc. that can be used at this step include the Hercules product.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask data preparation (step 130): This step provides the "tape-out" data for production of masks for lithographic use to produce finished chips. Example EDA software products from Synopsys, Inc. that can be used at this step include the CATS(R) family of products.

Figure 2:
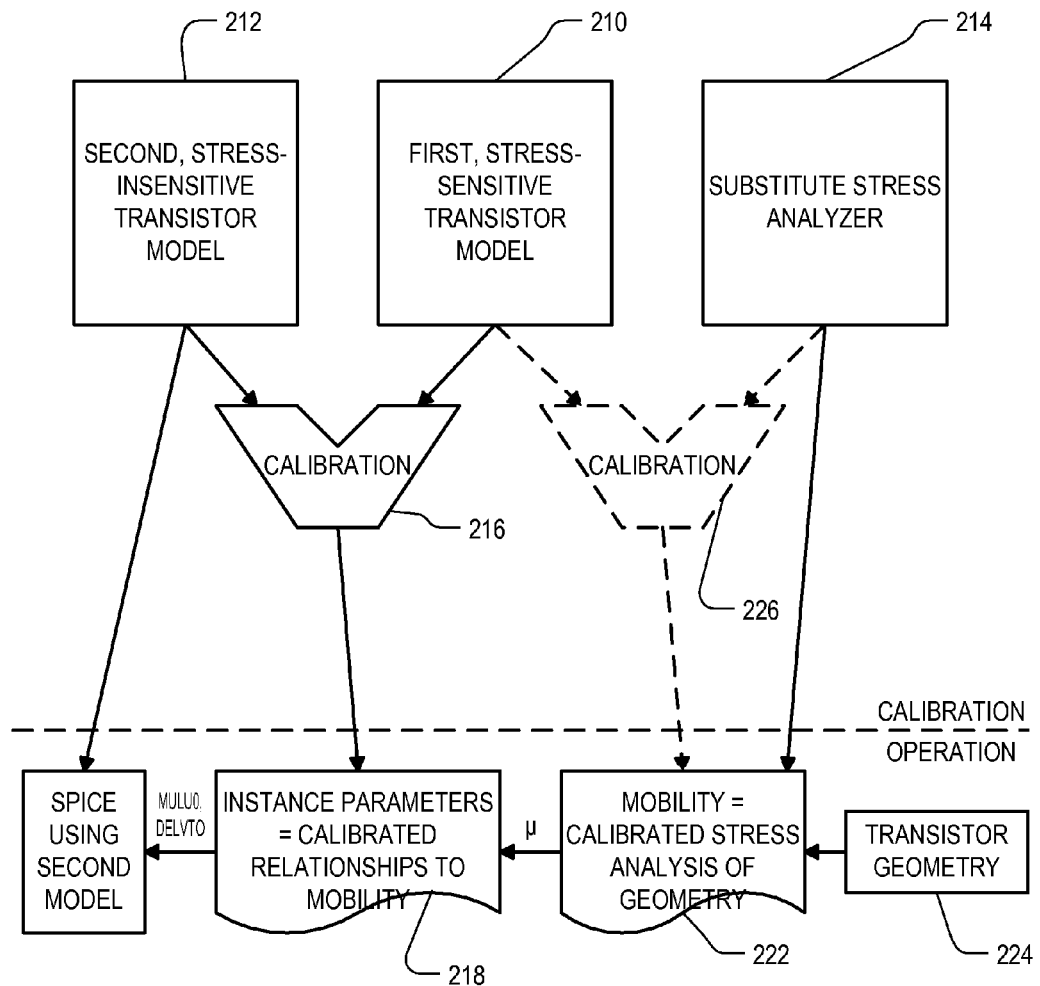
FIG. 2 is an overall diagram of the framework for an embodiment of the invention.

FIG. 2 is an overall diagram of the framework for an embodiment of the invention. Two transistor simulation models 210 and 212 are shown. A transistor simulation model uses a plurality of parameters, and some models segregate the parameters into "global" parameters, applicable to all transistors for which the model is invoked, and "instance" parameters, applicable only to a particular designated transistor or transistors. For some kinds of models, an instance parameter might completely override a corresponding global parameter. That is, if an instance parameter value is specified for a particular transistor, the model performs its calculations using the instance parameter value in place of the value for the corresponding global parameter. For other kinds of models, instance parameters may merely adjust corresponding global parameters. That is, if an instance adjustment parameter value is specified for a particular transistor, the model performs its calculations using the corresponding global parameter value as adjusted by the value specified for the instance parameter. For various parameters in various models, the adjustment may be additive, multiplicative, or may apply in some other way. For example, the instance adjustment parameter DELVTO is additive (adds to the global parameter VTO), whereas the instance adjustment parameter MULU0 is multiplicative (multiples against the global parameter U0).

Returning to FIG. 2, three stress analyzers are involved: one is part of a first, stress sensitive transistor model 210, which may for example be a transistor model based on BSIM 4.3; another is part of a second, stress insensitive transistor model 212, which may for example be the BSIM 4.3 model with its stress and sensitivity disabled; and a third is a substitute stress analyzer 214. In this context it is desired to replace the stress sensitivity method of the first model 210 with that calculated by the substitute stress analyzer 214. To accomplish this, the first, stress sensitive model 210 is removed from the equation and replaced by an external stress adjustment mechanism to be applied to the second, stress insensitive model 212. Because the first, stress sensitive model 210 is accurate in certain circumstances, it can be used to calibrate the external control that will be used on the second, stress insensitive transistor model 212 during operation. This calibration is performed by box 216, which yields a calibrated relationship 218 between the external control parameter, on the one hand, and one or more transistor instance parameters on the other hand, for application to the second, stress insensitive transistor model. In the embodiment of FIG. 2, the external control parameter is mobility, and the instance parameters are MULU0 and DELVTO. During operation, a mechanism other than that of the first, stress sensitive model 210, can be used to determine the mobility value for a particular transistor, which through the relationship 218, adjusts the values of the instance parameters to be applied for the particular transistor using the second, stress insensitive model 212. In this way the first, stress sensitive model 210 is used only for calibration, but otherwise is removed from the equation during production circuit analysis. Any other stress analyzer, preferably one that is more accurate than, or takes more stress sources into account than, that of the first model 210, can provide the stress adjustment to calculations instead.

In FIG. 2, the substitute stress analyzer is 214. It is used in box 222 during operation of the circuit analyzer, to convert transistor geometries 224 to the external control value to be applied to the relationship 218. If the substitute stress analyzer 214 is sufficiently accurate by itself, then it can be used directly in box 222. Typically, however, the substitute stress analyzer 214 includes one of more calibration coefficients which desirably should be calibrated before the substitute stress analyzer 214 is used in production mode. This calibration can be accomplished, again by reference to the layout circumstances in which the first, stress sensitive model 210 generates relatively accurate values for a stress-dependent transistor performance measure such as mobility. Such a calibration step is performed in box 226, which is shown with dashed lines because it is optional.

Figure 3:
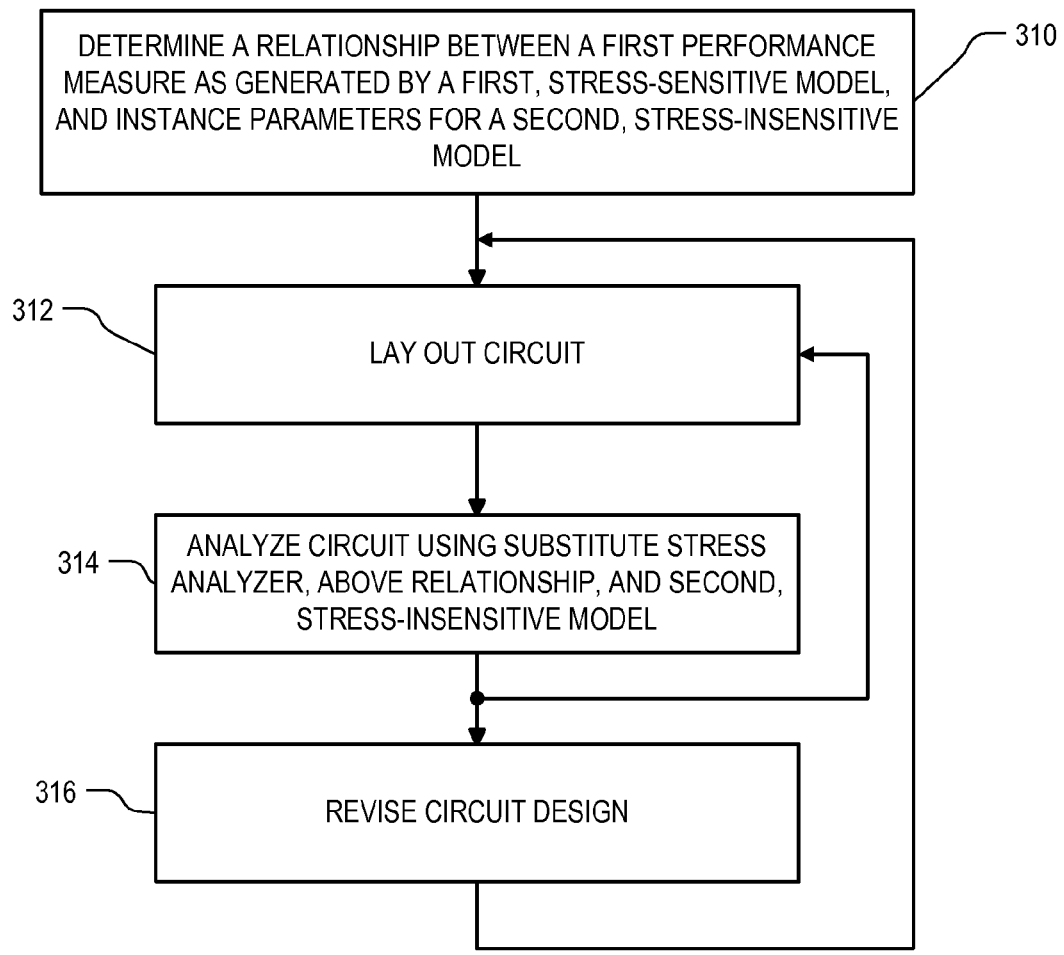
FIG. 3 is a flow chart of the overall operation of the system of FIG. 2.

FIG. 3 is another view of the operation of the system of FIG. 2, shown in a flow chart format. As with all flowcharts herein, it will be appreciated that many of the steps can be combined, performed in parallel or performed in a different sequence without affecting the functions achieved.

In FIG. 3, in a step 310, a relationship is first determined between a first performance measure as generated by a first, stress sensitive model, and instance parameters for a second, stress-insensitive model. The first performance measure is the external control referenced above, and may be, for example, carrier mobility. In FIG. 2, the first, stress sensitive model is 210, the second, stress insensitive model is 212, and the relationship is represented in box 218. If the first, stress sensitive model 210 is also responsive to the same instance parameters, those instance parameters are disabled in the first model 210 for the purpose of determining the relationship.

In a step 312, the circuit design is laid out using any desired layout software. Example products available from Synopsys, Inc. that can be used to perform step 312 are Astro and CosmosLE. As used herein, a "circuit design" is a transistor level design, after synthesis from VHDL or equivalent and before layout. Additionally, it will be understood that the layout performed in step 312 need not be of a complete circuit design, for example if only a portion of the circuit is to be simulated at this time.

A "layout" resulting from step 312 describes the layout "features" and that will eventually be used to define transistors, interconnects, and other functional and nonfunctional structures that will eventually appear on the integrated circuit device. The "features" include edges, materials, depths, and so on, that are specified by the layout to exist on the final integrated circuit. The transistor "geometry", as used herein, includes all the "layout features" that affect the calculations. Two sets of layout features are considered herein to be "different" if they differ in at least one aspect that affects stress in the channel.

Figure 4:
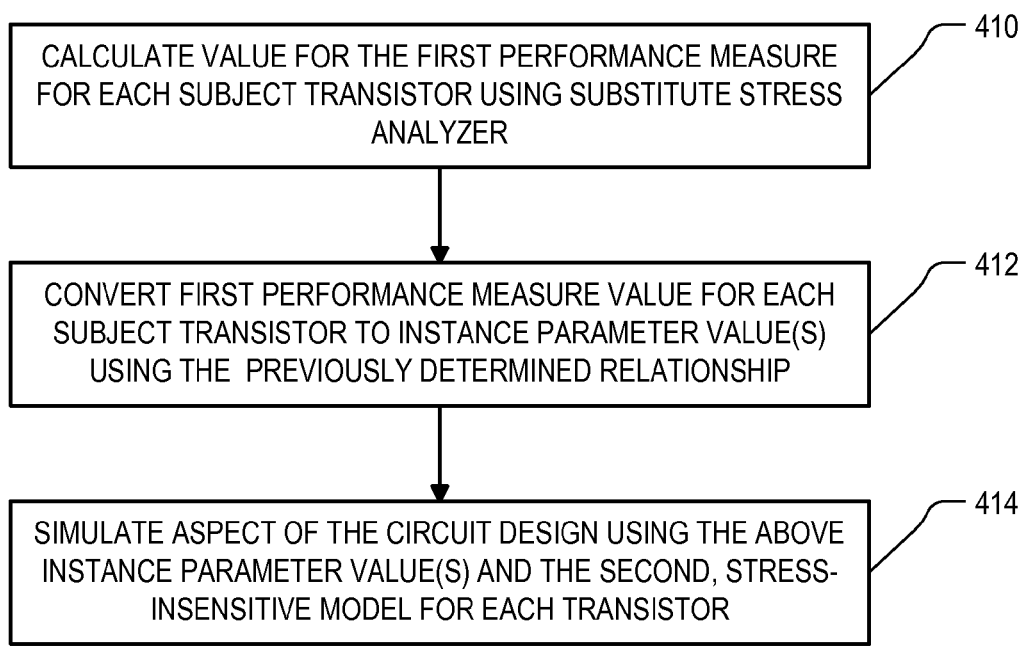
FIG. 4 is a flow chart detail of the substitute stress analyzer circuit analysis step of FIG. 3.

In step 314, the circuit is analyzed in using the substitute stress analyzer, the relationship determined in step 310, and the second, stress insensitive model. FIG. 4 illustrates step 314 in more detail. In step 410, for each subject transistor in the layout that is to be analyzed using the substitute stress analyzer 214, the substitute stress analyzer calculates a value for the first performance measure for the transistor. Preferably but not essentially, the substitute stress analyzer uses the techniques described in the above-incorporated U.S. patent application Ser. No. 11/291,294. Note that not all transistors, even within a single region of the layout, need be analyzed using the technique of FIGS. 2 and 3; some transistors can be analyzed using a different stress sensitive model, such as the first model 210 or some other stress sensitive model, or can be analyzed using a stress insensitive model if desired.

In step 412, the first performance measure value determined in step 410 for each of the subject transistors, is converted to the instance parameter values using the relationship previously determined in step 310. In the embodiment of FIG. 2, value of the first performance measure (mobility) is converted to the instance parameters MULU0 and DELVTO. In step 414 some aspect of the circuit design is simulated, for example using a version of SPICE, using the instance parameter values determined in step 412, and using the second, stress insensitive model 212 for each subject transistor.

Returning to FIG. 3, after the circuit or circuit portion has been analyzed in step 314, the user may decide to adjust certain aspects of the layout in response to the analysis. If so, then the method of FIG. 3 returns to step 312 to do so. Alternatively, the user may decide that the circuit design itself is to be revised. This is accomplished in step 316, and the method of FIG. 3 then returns to step 312 to lay out the circuit again. In either case, the analysis of step 314, using the substitute stress analyzer, the relationship determined in step 310, and the second stress insensitive model, can be performed without having to repeat the relationship determination step 310.

Figure 5:
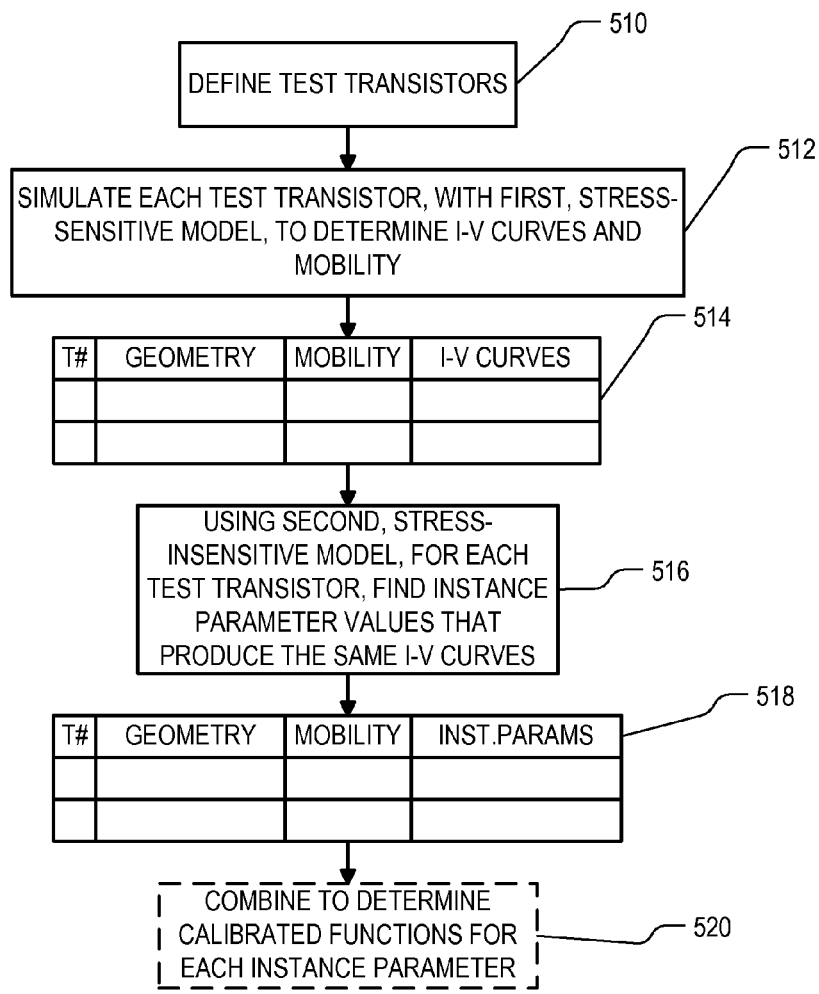
FIG. 5 is a flowchart detail illustrating one way in which the relationship 218 in FIG. 2 can be determined.

FIG. 5 is a flowchart detail illustrating one way in which the relationship 218 can be determined in step 310. In step 510, the user defines a set of test of transistors. These test transistors, which are expressed here in terms of their layout features, should be selected to exercise a variety of the layout circumstances to which the first, stress sensitive transistor model 210, responds with a desired level of accuracy. If the first transistor model 210 is an LOD-based model, for example, then it is desirable for the test transistors in step 510 to include transistors having all permutations of at least three different channel widths, at least three different channel lengths, and at least three different LOD's. In addition, some of test transistors should be isolated (only one transistor in the diffusion region) while others should share the diffusion regions with other transistors. Still others should be single-finger transistors while yet others are multi-finger transistors. In all, the set of transistors used in step 510 might include on the order of 50 to 100 transistors, as an example. It is not useful to include transistors which differ only on the basis of layout features that are not taken into account in the first, stress sensitive model 210. For example, for an LOD-based model 210, it is not useful to include transistors which differ only on the basis of layout features that are disposed beyond the longitudinally nearest diffusion/STI boundaries.

As used herein, the "longitudinal" direction of a transistor is the direction of current flow from source to drain when the transistor is turned on. The "transverse" direction is perpendicular to the longitudinal direction, and perpendicular to the direction of current flow. Both the longitudinal and transverse directions of the transistor are considered to be "lateral" directions, meaning a direction that is parallel to the surface. The "vertical" direction is normal to the surface of the channel and therefore perpendicular to all possible lateral directions. The "length" of a structure in the layout is its length in the longitudinal direction, and its "width" is its width in the transverse direction. The "longitudinally nearest" boundary is the boundary that is nearest in the longitudinal direction.

In step 512, each transistor in the set of test transistors is simulated using the first, stress sensitive model 210, to determine values for one or more performance measures of the transistor. In one embodiment only one performance measure, such as mobility, is determined here. In another embodiment, a value for a second parameter, for example the I-V curves of the transistor, are calculated. As used herein, the terms "parameter" and "value" are different. A "parameter" can be thought of merely as the name of a container that can hold a value, whereas a value is a particular value for the parameter. Additionally, as used herein, a parameter "value" need not be only a number. A set of I-V curves, for example, may be considered to constitute a single parameter "value", regardless of whether the I-V curves are represented graphically, or formulaically, or as a data structure. A set of I-V curves can be determined for a particular test transistor by simulating a circuit having not much more than the particular test transistor. Multiple simulations are performed on this transistor, with each simulation specifying a different combination of Vgs and Vds. Given these values, the simulator calculates Ids using the transistor model equations. The I-V curves are then described by the resulting (Vgs,Vds,Ids) triples. Preferably on the order of 50 such triples are calculated: 5 curves (5 values of Vgs), for example, with 10 points (Vds,Ids) calculated per curve. Again, if the model 210 has inputs corresponding to the instance parameters that will be determined in step 516, these instance parameters are disabled for the purposes of the simulations of step 512.

The simulations of step 512 result in a table such as that shown as 514, in which each entry sets forth the geometry for a particular one of the test transistors, and each of the values that were determined in step 512 as performance measures for that transistor.

In step 516, the same transistor geometries are simulated using the second, stress insensitive model 212, in order to identify instance parameter values that produce substantially the same value for one or more of the performance measures in the table 514. In the embodiment of FIG. 5 the target performance measure is the set of I-V curves, but in another embodiment, it could be the mobility, in which case no I-V curves need have been determined in step 512. It is not necessary that step 516 produce exactly the same values for the target performance measures as those in the table 514, as long as they are close enough for the purposes of the particular embodiment. For example, in an embodiment in which step 516 takes the form of an iterative search, it may be that after a certain number of iterations, further iterations are not likely to find instance parameter values that produce sufficiently closer values for the performance measure, to make the further iterations worthwhile.

Step 516 yields an updated table 518 containing, for each of the test transistors, both the value for the particular performance measure (e.g. mobility), as determined in step 512, and the set of one or more instance parameters, determined in step 516, which when applied to the second, stress insensitive model for the particular test transistor, will yield an acceptably close value for the particular performance measure. The table 518 describes the "mathematical relationship" 218 in FIG. 2, because it can be used to determine values for a set of one or more of the instance parameters, given a value for the performance measure. As used herein, a "mathematical relationship" between first and second parameters includes any relationship for which the value of a second parameter can be determined given the value of a first parameter (and given the value of any other necessary parameter). The mathematical relationship can take any desired form. For example it can take the form of a single mathematical function that takes the first parameter as an input and produces the second parameter as an output, or it can take the form of a plurality of different functions applicable in a piecewise manner. In yet another embodiment it can take the form of a table (such as table 518) correlating the first and second parameters, and allowing for interpolation or extrapolation (linear or otherwise) between or around table entries. Thus if desired for a particular embodiment, in step 520, tabular data such as that in table 518 can be combined, for example statistically fit to a predefined function format, thereby yielding a calibrated function for the instance parameters in the table. Again, in the embodiment of FIG. 2, there are two instance parameters: MULU0 and DELVTO. Thus step 520 would yield two different calibrated functions, one for each instance parameter.

Figure 6:
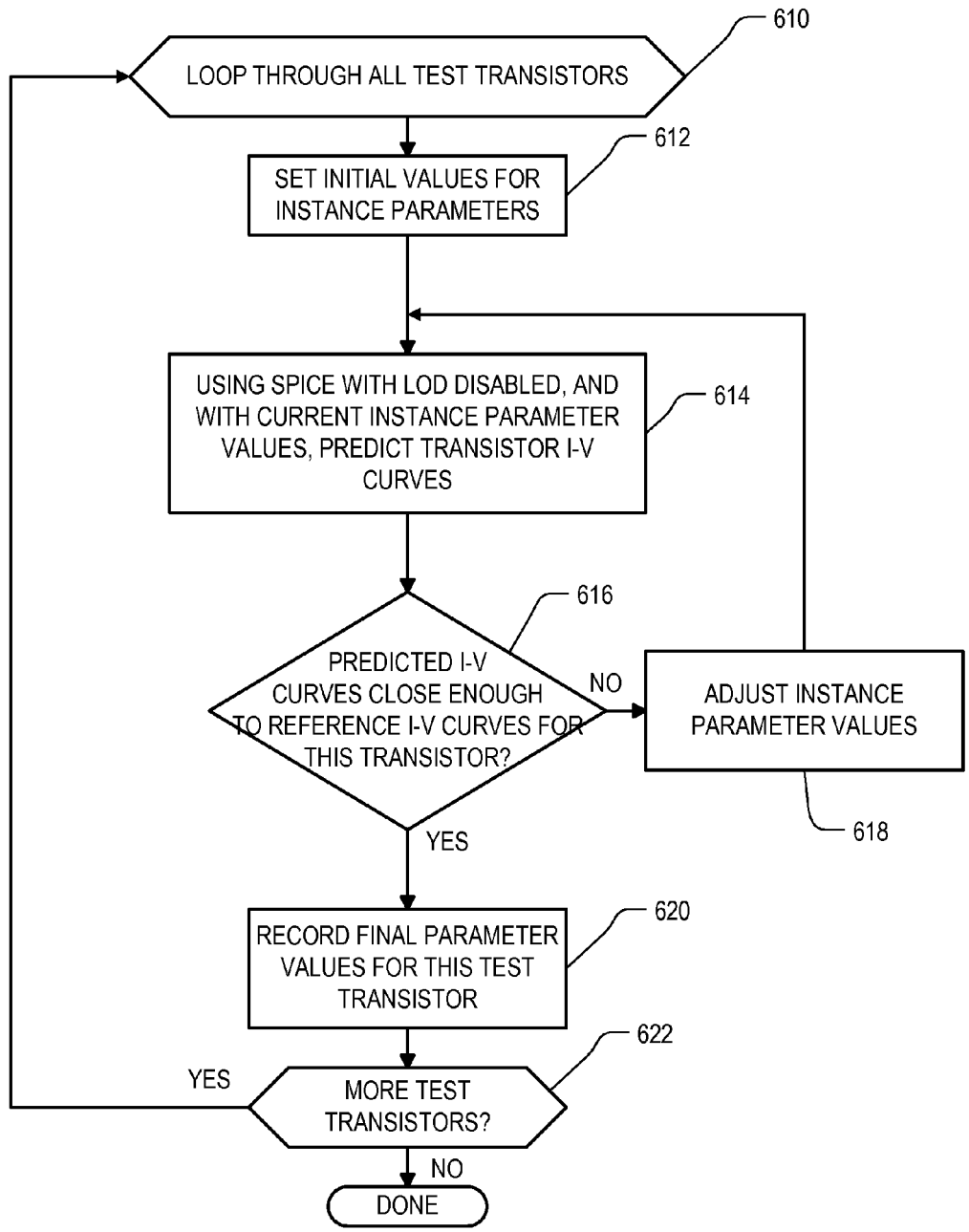
FIG. 6 illustrates an example method for finding instance parameters that produce matching values for a transistor performance measure.

The step 516 for finding instance parameters that produce matching values for one of the transistor performance measures, can be performed in any number of different ways. FIG. 6 illustrates one example, iterative, method that can be used. Referring to FIG. 6, in step 610, the system loops through all of the test transistors, so as to consider one test transistor at a time. In step 612 it sets initial values for the instance parameters, and in step 614, the system simulates the present transistor using the second, stress insensitive transistor model 212 and the present values for the instance parameters, to predict the value for the target performance measure. In an embodiment where the first, stress sensitive transistor model 210 is a BSIM 4 model which uses an LOD method for stress sensitivity, and where the second, stress insensitive transistor model 212 is the same as the first but with stress sensitivity disabled, and where the target performance measure is a set of transistor I-V curves, then step 614 is implemented by using the BSIM 4 SPICE model with stress sensitivity disabled, to predict the transistor I-V curves.

Note that the "disabling" of an aspect of a transistor model can take a number of different forms, depending on the aspect and depending on the model. It can, for example, take the form of setting a disable flag, or using default values for the input parameters to that aspect of the model. For example, in an LOD-enabled transistor model, stress sensitivity can be disabled by providing default, rather than actual, values for the input parameters to the LOD aspect. A default input value might be LOD=1 micron, which is large enough to render the stress effects on the channel negligible. Similarly, an instance adjustment parameter might be disabled by providing zero for an additive instance parameter like DELVTO, or unity for a multiplicative instance parameter like MULU0.

In step 616, the system determines whether the predicted I-V curves are close enough to the reference I-V curves for the present transistor as set forth in the table 514. As mentioned above with respect to step 516, it is not necessary that the predicted I-V curves exactly match those in the table 514; it is sufficient that they are substantially equal, to an accuracy that is reasonable for the particular embodiment. It will be appreciated, in fact, that an exact match may not even be possible.

If the predicted I-V curves are not close enough, then in step 618 the instance parameter values are adjusted in some algorithmically determined manner and the simulation of step 614 is performed again using the adjusted values. If they are close enough, then the final parameter values for this test transistor are recorded in table 518 (step 620), and if there are more transistors in the set of test transistors (step 622), then control returns to step 610 for finding appropriate instance parameter values for the next test transistor.

As previously mentioned, many substitute stress analyzers 214 can benefit from calibration. A stress analyzer using the techniques of the above-incorporated U.S. patent application Ser. No. 11/291,294, for example, might approximate a mobility enhancement value $\Delta\mu$ using a formula like $\Delta\mu = a\sigma_{xx} + b\sigma_{yy} + c\sigma_{zz}$, where $\sigma_{xx}$, $\sigma_{yy}$ and $\sigma_{zz}$ are the stress components calculated by the model and a, b and c are coefficients subject to calibration. The stress analyzer might also approximate the effect of distance on stress transmission using a function like $\lambda(r) = 1/(\alpha^* r^\beta + \epsilon)$, where r is the distance to a particular stress-affecting feature, and $\alpha$, $\beta$ and $\epsilon$ are all coefficients subject to calibration. In the case of a substitute stress analyzer subject to calibration, the calibration coefficients can be determined with reference to stress-varied simulations performed using the first, stress sensitive transistor model 210.

Figure 7:
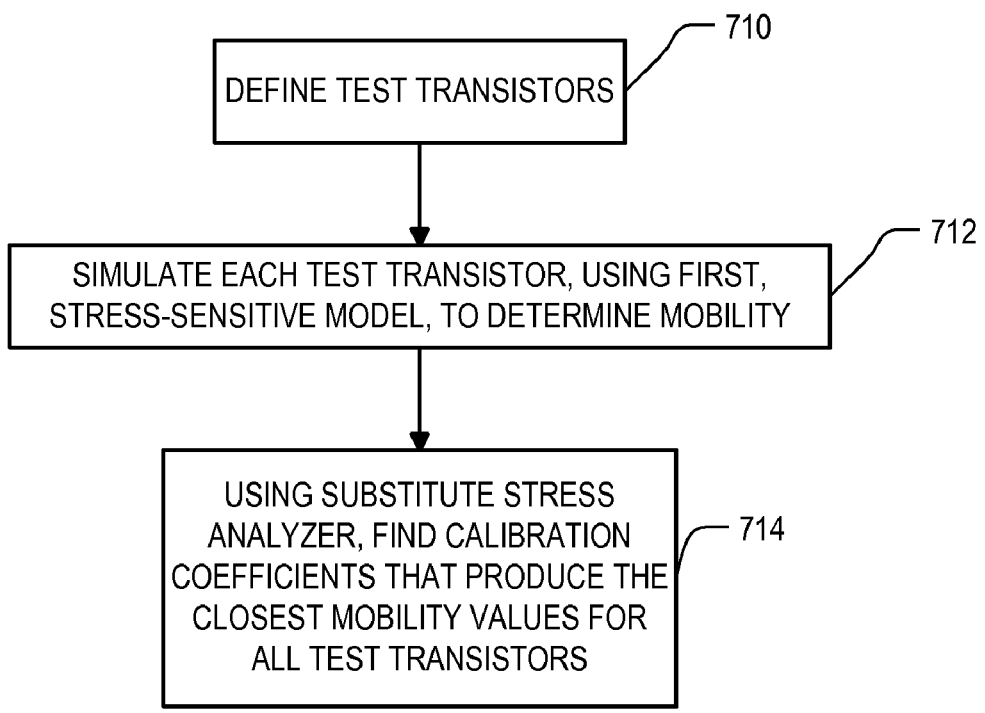
FIGS. 7 and 8 are alternative flowcharts illustrating how the substitute stress analyzer of FIG. 2 can be calibrated.

FIG. 7 is a flowchart illustrating one way in which the substitute stress analyzer 214 can be calibrated. In step 710, a set of test transistors is first defined. Preferably the principles described above with respect to the test transistor said chosen in step 510 (FIG. 5) are used here as well. In one embodiment, the set of test transistors defined in step 710 is the same as those defined in step 510. In such an embodiment, the next step, step 712, was already performed in step 512 (FIG. 5) and need not be repeated here. In another embodiment, the two sets of test transistors are different.

In step 712, each of the test transistors in the set is simulated using the first, stress sensitive transistor model 210, to determine a value for a particular transistor performance measure that can also be generated as an output of the substitute stress analyzer 214. In the embodiment of FIG. 7, the particular transistor performance measure is carrier mobility.

In step 714, using the substitute stress analyzer 214, the set of calibration coefficients that produce the closest mobility values for all test transistors is found. Preferably this is a global search, looking for a single set of calibration coefficients that together represent a multi-dimensional best fit over all the test transistors. A number of numerical techniques are known for accomplishing this, one example being the well known Newton's Method. Newton's Method, as well as some advantageous modifications thereof, are described, for example, in U.S. patent application Ser. No. 10/929,286, filed 30 Aug. 2004, by inventors Kucherov and Moroz, now U.S. Pat. No. 7,302,375, incorporated by reference in its entirety herein.

Figure 8:
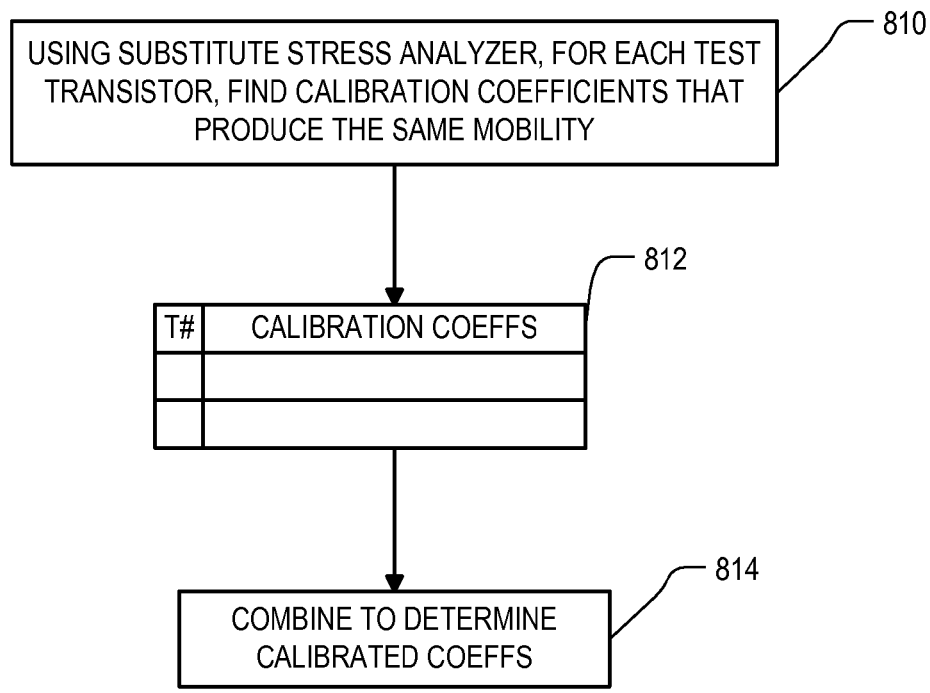

FIG. 8 sets forth a flow chart of an alternative method for calibrating the substitute stress analyzer. In the method of FIG. 8, a best-fit set of the calibration coefficients is determined separately for each of the test transistors, and then for each of the calibration coefficients, all the different value instances are combined either by averaging them (weighted or unweighted average), or by some other mathematical combination. Thus in step 810, using the substitute stress analyzer 214, for each test transistor in the set defined in step 710, the system finds the set of calibration coefficients that produce the same (or substantially the same) mobility value (or other transistor performance measure) as calculated in step 712 (FIG. 7). Numerical methods similar to those described above with respect to step 714 can be used in step 810 as well. Step 810 yields a table 812 containing, for each of the test transistors, the set of calibration coefficients that were determined in step 810. Each calibration coefficient can be thought of as being carried in a separate column of table 812. In step 814, for each of the calibration coefficients, all the values that were determined for that coefficient are combined to determine a single combined value for each of the calibration coefficients.

Once a set of calibration coefficients have been determined in step 714 or 814, the substitute stress analyzer can be used during circuit simulator operation to calculate a value of the stress-sensitive transistor performance measure in dependence upon the layout geometry of each subject transistor in a layout. As mentioned, this value is converted using the relationship 218 and applied to the second, stress-insensitive transistor model 212 as one or more instance parameter values during the simulation of the circuit. In one embodiment, the substitution of instance parameter values in dependence upon the substitute stress analyzer 214 can be integrated into the operation of the circuit simulator, such that the instance parameter values are calculated as needed, whenever the circuit simulator is about to execute the model for each subject transistor. In another embodiment, the instance parameter values for all subject transistors are calculated first, then applied to the circuit description before the simulator executes the model for any transistor in the circuit.

Note that the example performance measure referred to herein as carrier mobility may be input or output in different forms by different components of the arrangement of FIG. 2. For example, where the first and second transistor models 210 and 212 might generate values for carrier mobility literally, represented by the symbol $\mu$, the substitute stress analyzer 214 might generate a value for carrier mobility in the form of a mobility delta, $\Delta\mu$; or the opposite might be true. The value $\mu$ can be determined mathematically from $\Delta\mu$ by the equation $\mu = \mu_0 + \Delta\mu$, where $\mu_0$ is a base mobility value. As another example, one or another of the transistor models 210 and 212 or the substitute stress analyzer 214 might input or output mobility in the form of a mobility multiplier, which can be converted mathematically to µ by multiplying the multiplier against µ0. Because of the simple mathematical relationships between these different ways of expressing carrier mobility, as used herein, the term "mobility" refers to any or all of them, as the context demands. The term is not intended to be limited to its strictly literal meaning, µ. The same is true for all other performance measures and parameters referred to herein.

Figure 9:
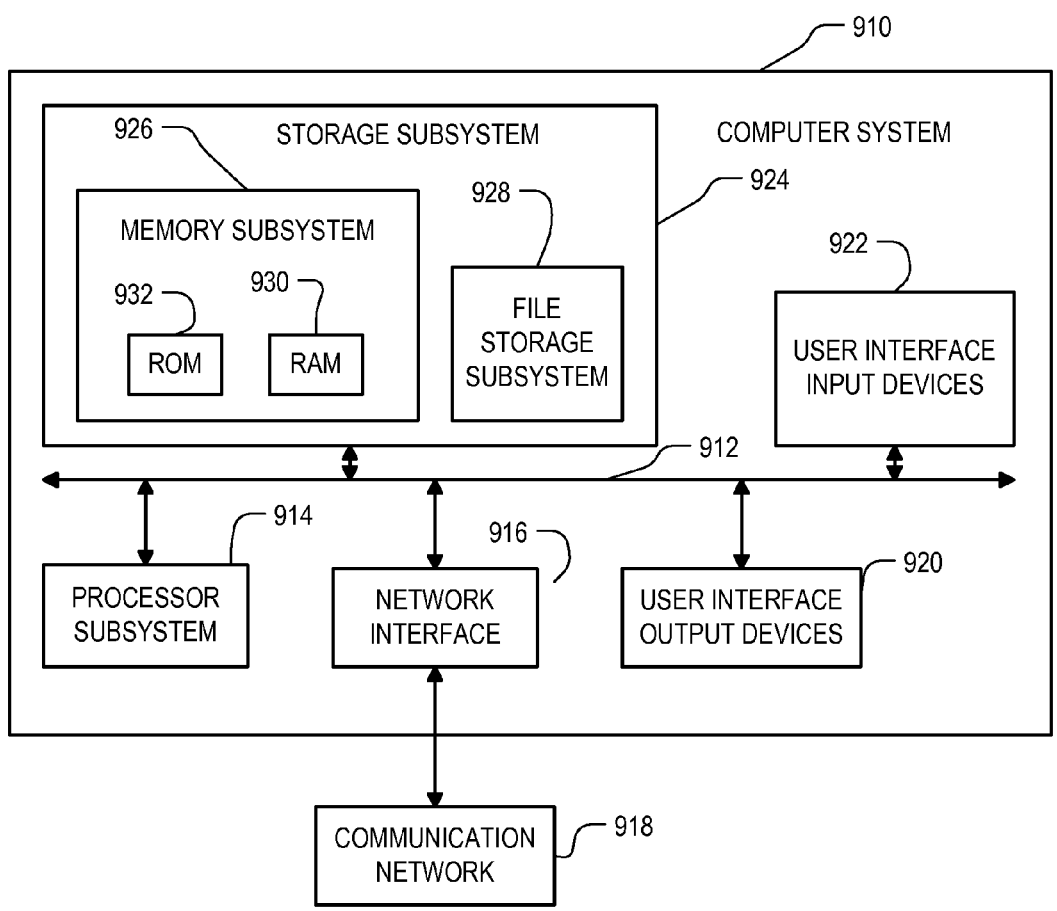
FIG. 9 is a simplified block diagram of a computer system incorporating aspects of the present invention.

FIG. 9 is a simplified block diagram of a computer system 910 that can be used to implement software incorporating aspects of the present invention. Computer system 910 typically includes a processor subsystem 914 which communicates with a number of peripheral devices via bus subsystem 912. These peripheral devices may include a storage subsystem 924, comprising a memory subsystem 926 and a file storage subsystem 928, user interface input devices 922, user interface output devices 920, and a network interface subsystem 916. The input and output devices allow user interaction with computer system 910. Network interface subsystem 916 provides an interface to outside networks, including an interface to communication network 918, and is coupled via communication network 918 to corresponding interface devices in other computer systems. Communication network 918 may comprise many interconnected computer systems and communication links. These communication links may be wireline links, optical links, wireless links, or any other mechanisms for communication of information. While in one embodiment, communication network 918 is the Internet, in other embodiments, communication network 918 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 922 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 910 or onto computer network 918.

User interface output devices 920 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 910 to the user or to another machine or computer system.

Storage subsystem 924 stores the basic programming and data constructs that provide the functionality of certain embodiments of the present invention. For example, the various modules implementing the functionality of certain embodiments of the invention may be stored in storage subsystem 924. These software modules are generally executed by processor subsystem 914.

Memory subsystem 926 typically includes a number of memories including a main random access memory (RAM) 930 for storage of instructions and data during program execution and a read only memory (ROM) 932 in which fixed instructions are stored. File storage subsystem 928 provides persistent storage for program and data files, and may include a hard disk drive, a floppy disk drive along with associated removable media, a CD-ROM drive, an optical drive, or removable media cartridges. The databases and modules implementing the functionality of certain embodiments of the invention may have been provided on a computer readable medium such as one or more CD-ROMs, and may be stored by file storage subsystem 928. The host memory 926 contains, among other things, computer instructions which, when executed by the processor subsystem 914, cause the computer system to operate or perform functions as described herein. As used herein, processes and software that are said to run in or on "the host" or "the computer", execute on the processor subsystem 914 in response to computer instructions and data in the host memory subsystem 926 including any other local or remote storage for such instructions and data.

Bus subsystem 912 provides a mechanism for letting the various components and subsystems of computer system 910 communicate with each other as intended. Although bus subsystem 912 is shown schematically as a single bus, alternative embodiments of the bus subsystem may use multiple busses.

Computer system 910 itself can be of varying types including a personal computer, a portable computer, a workstation, a computer terminal, a network computer, a television, a mainframe, or any other data processing system or user device. Due to the ever-changing nature of computers and networks, the description of computer system 910 depicted in FIG. 9 is intended only as a specific example for purposes of illustrating the preferred embodiments of the present invention. Many other configurations of computer system 910 are possible having more or less components than the computer system depicted in FIG. 9.

As used herein, a given value is "responsive" to a predecessor value if the predecessor value influenced the given value. If there is an intervening processing element or step, the given value can still be "responsive" to the predecessor value. If the intervening processing element or step combines more than one value, the value output of the processing element or step is considered "responsive" to each of the value inputs. If the given value is the same as the predecessor value, this is merely a degenerate case in which the given value is still considered to be "responsive" to the predecessor value. "Dependency" of a given value upon another value is defined similarly.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, whereas the description above uses BSIM models as example transistor models, it will be appreciated that other models, not based on BSIM, can be used as well. Such other models can include, without limitation, those based on the Penn State Philips (PSP) model (described in G. D. J. Smit, R. van Langevelde, A. J. Scholten, D. B. M. Klaassen, G. Gildenblat, X. Li, H. Wang, and W. Wu, "PSP 102.0" (June 2006), incorporated by reference herein), or the HiSIM-RF surface potential model. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method for analyzing a circuit, comprising the steps of:

using a computer, determining a relationship between values for a first performance measure as generated by a first, stress-sensitive, transistor model, and values for a set of transistor instance parameters applicable to a second, stress-insensitive, transistor model, such that for the layout characteristics of at least a subset of transistors, application of the transistor instance parameter values to the second, stress-insensitive, transistor model yields substantially the same value for a second performance measure as does the first, stress-sensitive, transistor model;

for each particular transistor in a plurality of transistors in a layout of a circuit design, using a substitute stress analyzer on a computer to determine a value for the first performance measure in dependence upon the layout characteristics of the particular transistor;

in dependence upon the relationship, using a computer to convert the first performance measure values determined for each transistor in the plurality of transistors to a corresponding set of transistor instance parameter values; and using a computer, simulating an aspect of the circuit design using the second, stress-insensitive, transistor model for each given transistor in the plurality of transistors, in dependence upon the set of transistor instance parameter values obtained for the given transistor.

2. A method according to claim 1, wherein the first performance measure is carrier mobility, wherein the first, stress-sensitive, transistor model considers only those stress effects deriving from the length of a diffusion region between a transistor channel and the nearest diffusion region boundary in a longitudinal direction, wherein the transistor instance parameters are MULU0 and DELVTO, wherein the second, stress-insensitive, transistor model is the same as the first model except with stress sensitivity disabled, and wherein the second performance measure is a set of I-V curves.

3. A method according to claim 1, wherein the first, stress sensitive, transistor model ignores stress in a second direction other than the longitudinal direction, and wherein the substitute stress analyzer takes into account both stress in the second direction and stress in the longitudinal direction.

4. A method according to claim 1, wherein the first, stress sensitive, transistor model ignores layout features beyond the nearest diffusion region boundary in a particular direction, and wherein the substitute stress analyzer takes into account layout features beyond the nearest diffusion region boundary in the particular direction.

5. A method according to claim 1, further comprising the step of determining a set of at least one calibration coefficient for the substitute stress analyzer, such that for at least a plurality of transistors having different layout features, the substitute stress analyzer generates substantially the same values for the first performance measure that would be generated by the first, stress-sensitive, transistor model.

6. A method according to claim 5, wherein the step of determining a set of at least one calibration coefficient for the substitute stress analyzer, comprises the steps of:

simulating each of a first plurality of test transistors using the first, stress-sensitive, transistor model, to develop respective values for the first performance measure; and optimizing the set of calibration coefficients such that over all of the transistors in the first plurality of test transistors, the substitute stress analyzer generates values for the first performance measure which are closest, according to a predetermined closeness measure, to the values developed in the step of simulating each of a first plurality of test transistors.

7. A method according to claim 6, wherein the step of determining a relationship between values for a first performance measure and values for a set of transistor instance parameters, comprises the steps of:

simulating each of a second plurality of test transistors having different layout features, using the first, stress-sensitive, transistor model, to develop respective values for the second performance measure; and for each of the transistors in the second plurality of test transistors, finding values for the parameters in the set of transistor instance parameters for which the second, stress-insensitive, model generates a value for the second performance measure that is substantially the same as that developed using the first, stress-sensitive, transistor model.

8. A method according to claim 7, wherein the first plurality of test transistors is the same as the second plurality of test transistors.

9. A method according to claim 1, wherein the step of determining a relationship between values for a first performance measure and values for a set of transistor instance parameters, comprises the steps of:

simulating each of a first plurality of test transistors having different layout features, using the first, stress-sensitive, transistor model, to develop respective values for the second performance measure; and for each of the transistors in the first plurality of test transistors, finding values for the parameters in the set of transistor instance parameters for which the second, stress-insensitive, model generates a value for the second performance measure that is substantially the same as that developed using the first, stress-sensitive, transistor model.

10. A method according to claim 9, wherein the second performance measure is the same as the first performance measure.

11. A method according to claim 1, wherein the aspect of the circuit design simulated in the step of simulating an aspect of the circuit design comprises a member of the group consisting of DC characteristics of the circuit, AC characteristics of the circuit, transient characteristics of the circuit, and RF characteristics of the circuit.

12. A computer program product for analyzing a circuit, stored in a manner that is readable by a processing subsystem, comprising computer instructions, which when executed by the processing subsystem:

determine a relationship between values for a first performance measure as generated by a first, stress-sensitive, transistor model, and values for a set of transistor instance parameters applicable to a second, stress-insensitive, transistor model, such that for the layout characteristics of at least a subset of transistors, application of the transistor instance parameter values to the second, stress-insensitive, transistor model yields substantially the same value for a second performance measure as does the first, stress-sensitive, transistor model;

for each particular transistor in a plurality of transistors in a layout of a circuit design, use a substitute stress analyzer to determine a value for the first performance measure in dependence upon the layout characteristics of the particular transistor;

in dependence upon the relationship, convert the first performance measure values determined for each transistor in the plurality of transistors to a corresponding set of transistor instance parameter values; and simulate an aspect of the circuit design using the second, stress-insensitive, transistor model for each given transistor in the plurality of transistors, in dependence upon the set of transistor instance parameter values obtained for the given transistor.

13. A system for analyzing a circuit, comprising:
memory, and a data processor coupled to the memory, the data processor configured to:
determine a relationship between values for a first performance measure as generated by a first, stress-sensitive, transistor model, and values for a set of transistor instance parameters applicable to a second, stress-insensitive, transistor model, such that for the layout characteristics of at least a subset of transistors, application of the transistor instance parameter values to the second, stress-insensitive, transistor model yields substantially the same value for a second performance measure as does the first, stress-sensitive, transistor model;

for each particular transistor in a plurality of transistors in a layout of a circuit design, use a substitute stress analyzer to determine a value for the first performance measure in dependence upon the layout characteristics of the particular transistor;

in dependence upon the relationship, convert the first performance measure values determined for each transistor in the plurality of transistors to a corresponding set of transistor instance parameter values; and simulate an aspect of the circuit design using the second, stress-insensitive, transistor model for each given transistor in the plurality of transistors, in dependence upon the set of transistor instance parameter values obtained for the given transistor.

14. A system according to claim 13, wherein the first performance measure is carrier mobility,
wherein the first, stress-sensitive, transistor model considers only those stress effects deriving from the length of a diffusion region between a transistor channel and the nearest diffusion region boundary in a longitudinal direction,
wherein the transistor instance parameters are MULU0 and DELVTO,
wherein the second, stress-insensitive, transistor model is the same as the first model except with stress sensitivity disabled,
and wherein the second performance measure is a set of I-V curves.

15. A system according to claim 13, wherein the first, stress sensitive, transistor model ignores stress in a second direction other than the longitudinal direction,
and wherein the substitute stress analyzer takes into account both stress in the second direction and stress in the longitudinal direction.

16. A system according to claim 13, wherein the first, stress sensitive, transistor model ignores layout features beyond the nearest diffusion region boundary in a particular direction,
and wherein the substitute stress analyzer takes into account layout features beyond the nearest diffusion region boundary in the particular direction.

17. A system according to claim 13, wherein the data processor is configured further to determine a set of at least one calibration coefficient for the substitute stress analyzer, such that for at least a plurality of transistors having different layout features, the substitute stress analyzer generates substantially the same values for the first performance measure that would be generated by the first, stress-sensitive, transistor model.

18. A system according to claim 17, wherein the data processor's configuration to determine a set of at least one calibration coefficient for the substitute stress analyzer, includes the data processor being configured to:
simulate each of a first plurality of test transistors using the first, stress-sensitive, transistor model, to develop respective values for the first performance measure; and
optimize the set of calibration coefficients such that over all of the transistors in the first plurality of test transistors, the substitute stress analyzer generates values for the first performance measure which are closest, according to a predetermined closeness measure, to the values developed when the data processor simulates each of a first plurality of test transistors.

19. A system according to claim 13, wherein the data processor's configuration to determine a relationship between values for a first performance measure and values for a set of transistor instance parameters, includes the data processor being configured to:
simulate each of a first plurality of test transistors having different layout features, using the first, stress-sensitive, transistor model, to develop respective values for the second performance measure; and
for each of the transistors in the first plurality of test transistors, find values for the parameters in the set of transistor instance parameters for which the second, stress-insensitive, model generates a value for the second performance measure that is substantially the same as that developed using the first, stress-sensitive, transistor model.

20. A product according to claim 12, wherein the first performance measure is carrier mobility,
wherein the first, stress-sensitive, transistor model considers only those stress effects deriving from the length of a diffusion region between a transistor channel and the nearest diffusion region boundary in a longitudinal direction,
wherein the transistor instance parameters are MULU0 and DELVTO,
wherein the second, stress-insensitive, transistor model is the same as the first model except with stress sensitivity disabled,
and wherein the second performance measure is a set of I-V curves.

21. A product according to claim 12, wherein the first, stress sensitive, transistor model ignores stress in a second direction other than the longitudinal direction,
and wherein the substitute stress analyzer takes into account both stress in the second direction and stress in the longitudinal direction.

22. A product according to claim 12, wherein the first, stress sensitive, transistor model ignores layout features beyond the nearest diffusion region boundary in a particular direction,
and wherein the substitute stress analyzer takes into account layout features beyond the nearest diffusion region boundary in the particular direction.

23. A product according to claim 12, wherein the computer instructions, which when executed by the processing subsystem further determine a set of at least one calibration coefficient for the substitute stress analyzer, such that for at least a plurality of transistors having different layout features, the substitute stress analyzer generates substantially the same values for the first performance measure that would be generated by the first, stress-sensitive, transistor model.

24. A product according to claim 23, wherein the computer instructions which when executed by the processing subsystem determine a set of at least one calibration coefficient for the substitute stress analyzer, include computer instructions which when executed by the processing subsystem:

- simulate each of a first plurality of test transistors using the first, stress-sensitive, transistor model, to develop respective values for the first performance measure; and
- optimize the set of calibration coefficients such that over all of the transistors in the first plurality of test transistors, the substitute stress analyzer generates values for the first performance measure which are closest, according to a predetermined closeness measure, to the values developed when the computer instructions which simulate each of a first plurality of test transistors are executed.

25. A product according to claim 12, wherein the computer instructions which when executed by the processing subsystem determine a relationship between values for a first performance measure and values for a set of transistor instance parameters, include computer instructions which when executed by the processing subsystem:

- simulate each of a first plurality of test transistors having different layout features, using the first, stress-sensitive, transistor model, to develop respective values for the second performance measure; and
- for each of the transistors in the first plurality of test transistors, find values for the parameters in the set of transistor instance parameters for which the second, stress-insensitive, model generates a value for the second performance measure that is substantially the same as that developed using the first, stress-sensitive, transistor model.

* * * * *